(12) United States Patent
Hiller et al.

(10) Patent No.: US 7,535,264 B2
(45) Date of Patent: May 19, 2009

(54) METHODS AND SYSTEMS FOR COMPARING CURRENTS USING CURRENT CONVEYOR CIRCUITRY

(75) Inventors: James G. Hiller, Minnetonka, MN (US); Paul M. Werking, Rockford, MN (US)

(73) Assignee: Honeywell International Inc., Morristown, NJ (US)

( * ) Notice: Subject to any disclaimer, the term of this patent is extended or adjusted under 35 U.S.C. 154(b) by 74 days.

(21) Appl. No.: 11/847,973

(22) Filed: Aug. 30, 2007

(65) Prior Publication Data

US 2009/0058469 A1    Mar. 5, 2009

(51) Int. Cl.
*H03K 5/22*    (2006.01)

(52) U.S. Cl. .............................. 327/66; 327/63; 327/65; 327/69; 327/70

(58) Field of Classification Search ............... 327/63, 327/65, 66, 69, 70
See application file for complete search history.

(56) References Cited

U.S. PATENT DOCUMENTS

| | | | | |
|---|---|---|---|---|
| 4,983,930 | A | 1/1991 | Wadsworth | 330/288 |
| 5,055,719 | A | 10/1991 | Hughes | 307/491 |
| 5,124,666 | A | 6/1992 | Liu et al. | 330/253 |
| 5,594,390 | A | 1/1997 | Holzer | 331/17 |
| 6,205,073 | B1 | 3/2001 | Naji | 365/209 |
| 6,600,362 | B1 | 7/2003 | Gavrila | 327/541 |
| 6,931,605 | B2 * | 8/2005 | Rajput et al. | 716/1 |
| 7,183,851 | B2 | 2/2007 | Song | 330/257 |
| 7,193,456 | B1 | 3/2007 | Aude | 327/581 |

OTHER PUBLICATIONS

Sedra A.S., "The Current Conveyor: History, Progress and New Results," IEE Proceedings, vol. 137, Pt. G, No. 2, Apr. 1990, p. 78-87.
Ferri et al., "Low-Voltage Low-Power CMOS Current Conveyors," ISBN 1-4020-7486-7, p. 31-40, 84-85, 119-126.
Wilson, B., "Recent Developments in Current Conveyors and Current-Mode Circuits," IEE Proceedings, vol. 137, Pt. G, No. 2, Apr. 1990, p. 63-77.

(Continued)

*Primary Examiner*—Long Nguyen
*Assistant Examiner*—Brandon S Cole
(74) *Attorney, Agent, or Firm*—McDonnell Boehnen Hulbert & Berghoff LLP (57) ABSTRACT

Methods and systems are provided for comparing currents. The method includes driving a first current through a first X leg of a first current conveyor circuit and a second current through a second X leg of a second current conveyor circuit. The method further includes draining a third current from a first X terminal of the first current conveyor circuit to produce a first positive transistor current and a first negative transistor current, and draining a fourth current from a second X terminal of the second current conveyor circuit to produce a second positive transistor current and a second negative transistor current. The method further includes summing the first positive transistor current and the second negative transistor current to produce a first current output, the first negative transistor current and the second positive transistor current to produce a second current output, and the first current output and the second current output to produce a summed current output.

20 Claims, 7 Drawing Sheets

OTHER PUBLICATIONS

Sedra et al., "A Second-Generation Current Conveyor and Its Applications," IEEE Transactions on Circuit Theory, Feb. 1970, p. 132-134.

Cheng et al., "3V MOS Current Conveyor Cell for VLSI Technology," Electronic Letters, Feb. 4, 1993, vol. 29, No. 3, p. 317-319.

Surakampontorn et al., "Accurate CMOS-based Current Conveyors," IEEE Transactions on Instrumentation and Measurement, vol. 40, No. 4, Aug. 1991, p. 699-702.

Gerri et al. "Current-Conveyors III," Electronics World, May 2001, p. 378-381.

* cited by examiner

METHODS AND SYSTEMS FOR COMPARING CURRENTS USING CURRENT CONVEYOR CIRCUITRY

GOVERNMENT RIGHTS

The United States Government has acquired certain rights in this invention pursuant to Contract No. N00030-05-C-0009 awarded by the U.S. Navy.

FIELD OF THE INVENTION

The present invention relates generally to current conveyor circuits, and more particularly, relates to comparing currents using current conveyor circuitry.

BACKGROUND

Current conveyor circuits are relatively well-known devices Typically, a current conveyor circuit includes a Y terminal (a voltage-input terminal for second-generation current conveyor circuits, for instance), an X terminal (a current-input terminal), and a Z terminal (a current-output terminal). A reference voltage is applied to the Y terminal, and the reference voltage drives an ideally equal voltage at the X terminal. Further, a reference current may be driven through the current conveyor circuit, and an input current may be applied to the X terminal (i.e., a current is drained from the X terminal). The input current applied to the X terminal is preferably conveyed to the Z terminal, which is at a higher impedance level than the X terminal.

Current conveyor circuits may be used in a variety of applications. For instance, current conveyor circuits may be used to compare input currents. As an example, the Z terminal output current of a first current conveyor circuit may be compared to the Z terminal output current of a second current conveyor circuit. Based on a comparison of the respective output currents, the difference between the input current applied to the X terminal of the first current conveyor circuit and the input current applied to the X terminal of the second current conveyor circuit may be inferred (since the input current applied to the X terminal is preferably conveyed to the Z terminal).

However, there are limitations associated with current conveyor circuits, and with using current conveyor circuits to compare input currents. For instance, the input current applied to the X terminal will be accurately conveyed to the Z terminal only when the input current is much smaller than the reference current driven through the current conveyor circuit (e.g., 10× smaller). Hence, the input current applied to the X terminal of a current conveyor circuit and the output current conveyed to the Z terminal are usually small.

Because the input current applied to the X terminal and the output current conveyed to the Z terminal are usually small, comparing the Z terminal output current of a first current conveyor circuit to the Z terminal output current of a second current conveyor circuit may be problematic. As examples, detecting the current difference between the respective Z terminal output currents may be slow and inaccurate.

Additionally, the reference voltage applied to the Y terminal may not always remain constant. For instance, variations in temperature (or other processes, more generally) may cause the reference voltage to fluctuate. If the reference voltage applied to the Y terminal does not remain constant, then the overall functionality of the current conveyor circuit may be adversely affected. As an example, the input current applied to the X terminal may fluctuate. Needless to say, fluctuations in the input current applied to the X terminal of either the first or second current conveyor circuit may cause further problems in comparing input currents.

SUMMARY

Methods and systems are provided for improved current conveyor operation. A method for comparing currents is described. In a circuit including a first current conveyor circuit that includes a first X leg with a first X terminal, and a second current conveyor circuit that includes a second X leg with a second X terminal, the method includes driving a first current through the first X leg, and driving a second current through the second X leg. The method also includes draining a third current from the first X terminal to produce a first positive transistor current and a first negative transistor current, and draining a fourth current from the second X terminal to produce a second positive transistor current and a second negative transistor current. The method further includes summing the first positive transistor current and the second negative transistor current to produce a first current output, summing the first negative transistor current and the second positive transistor current to produce a second current output, and summing the first current output and the second current output to produce a summed current output.

The first current conveyor circuit may include a first positive transistor and a first negative transistor, and the second current conveyor circuit may include a second positive transistor and a second negative transistor. In one embodiment, draining the third current from the first X terminal to produce the first positive transistor current and the first negative transistor current includes the first positive transistor producing the first positive transistor current and the first negative transistor producing the first negative transistor current. In another embodiment, draining the fourth current from the second X terminal to produce the second positive transistor current and the second negative transistor current includes the second positive transistor producing the second positive transistor current and the second negative transistor producing the second negative transistor current.

In other embodiments, draining the third current from the first X terminal may include draining a current above a threshold current ratio from the first X terminal to turn off the first negative transistor. When the first negative transistor turns off, the first negative transistor current is a zero current. And when the first negative transistor current is a zero current, the second current output is preferably a non-zero current. In yet other embodiments, draining the fourth current from the second X terminal may include draining a current above a threshold current ratio from the second X terminal to turn off the second negative transistor. When the second negative transistor turns off, the second negative transistor current is a zero current. And when the second negative transistor current is a zero current, the first current output is preferably a non-zero current.

In one embodiment, summing the first positive transistor current and the second negative transistor current to produce the first current output includes an adder summing the first positive transistor current and the second negative transistor current. In another embodiment, summing the first negative transistor current and the second positive transistor current to produce the second current output includes the adder summing the first negative transistor current and the second positive transistor current. In yet another embodiment, summing the first current output and the second current output to produce the summed current output includes the adder summing the first current output and the second current output.

The circuit may include a differential amplifier that includes a first current load input and a second current load input. The method may further include coupling the first current output to the first current load input, and coupling the second current output to the second current load input to cooperatively produce a first voltage output corresponding to the first current output and a second voltage output corresponding to the second current output. The differential amplifier may also include a reference current input, and the method may further include connecting the summed current output to the reference current input of the differential amplifier to hold an average of the first voltage output and the second voltage output substantially constant. The method may further include comparing the first voltage output to the second voltage output to provide an indication of whether the first current output is greater than the second current output.

The first current conveyor circuit may include a first Y leg that includes a first Y terminal, and a first reference voltage may be applied to the first Y terminal. The method may further include holding the first reference voltage substantially constant by coupling a first inverter with unity feedback to the first Y terminal. The second current conveyor circuit may also include a second Y leg that includes a second Y terminal, and a second reference voltage may be applied to the second Y terminal. The method may further include holding the second reference voltage substantially constant by coupling a second inverter with unity feedback to the second Y terminal.

A system for comparing currents is also described. The system includes a first current conveyor circuit that includes a first Y leg and a first X leg. The first X leg includes a first X terminal, a first positive transistor, and a first negative transistor. The first Y leg drives a first current through the first X leg, and the first X terminal drains a second current such that the first positive transistor produces a first positive transistor current and the first negative transistor produces a first negative transistor current. The system also includes a second current conveyor circuit that includes a second Y leg and a second X leg. The second X leg includes a second X terminal, a second positive transistor, and a second negative transistor. The second Y leg drives a third current through the second X leg, and the second X terminal drains a fourth current such that the second positive transistor produces a second positive transistor current and the second negative transistor produces a second negative transistor current. The system may further include an adder coupled to the first current conveyor circuit and the second current conveyor circuit, and operable to sum the first positive transistor current and the second negative transistor current to produce a first current output, sum the first negative transistor current and the second positive transistor current to produce a second current output, and sum the first current output and the second current output to produce a summed current output.

In one embodiment, the adder being coupled to the first current conveyor circuit includes the adder being coupled to the first positive transistor and first negative transistor. In another embodiment, the adder being coupled to the second current conveyor circuit includes the adder being coupled to the second positive transistor and second negative transistor.

In some embodiments, the first X terminal drains a current above a threshold current ratio to turn off the first negative transistor. When the first negative transistor turns off, the first negative transistor current is a zero current. And when the first negative transistor Current is a zero current, the second current output is preferably a non-zero current. In other embodiments, the second X terminal drains a current above a threshold current ratio to turn off the second negative transistor. When the second negative transistor turns off, the second negative transistor current is a zero current. And when the second negative transistor current is a zero current, the first current output is preferably a non-zero current.

The system may include a differential amplifier coupled to the adder, the differential amplifier including a first current load input and a second current load input. In one embodiment, the first current output is coupled to the first current load input and the second current output is coupled to the second current load input such that the differential amplifier produces a first voltage output corresponding to the first current output and a second voltage output corresponding to the second current output. The differential amplifier may also include a reference current input. In some embodiments, the summed current output is connected to the reference current input of the differential amplifier to hold an average of the first voltage output and the second voltage output substantially constant.

The system may also include a comparator coupled to the differential amplifier. In one embodiment, the comparator compares the first voltage output and the second voltage output to provide an indication of whether the first current output is greater than the second current output.

The first Y leg may include a first Y terminal, and a first reference voltage may be applied to the first Y terminal. In one embodiment, the system includes a first inverter with unity feedback coupled to the first Y terminal to hold the first reference voltage substantially constant. Similarly, the second Y leg may include a second Y terminal, and a second reference voltage may be applied to the second Y terminal. In another embodiment, the system includes a second inverter with unity feedback coupled to the second Y terminal to hold the second reference voltage substantially constant.

These as well as other aspects and advantages will become apparent to those of ordinary skill in the art by reading the following detailed description, with reference where appropriate to the accompanying drawings. Further, it is understood that this summary is merely an example and is not intended to limit the scope of the invention as claimed.

BRIEF DESCRIPTION OF THE DRAWINGS

Presently preferred embodiments are described below in conjunction with the appended drawing figures, wherein like reference numerals refer to like elements in the various figures, and wherein.

DETAILED DESCRIPTION

Figure 1:
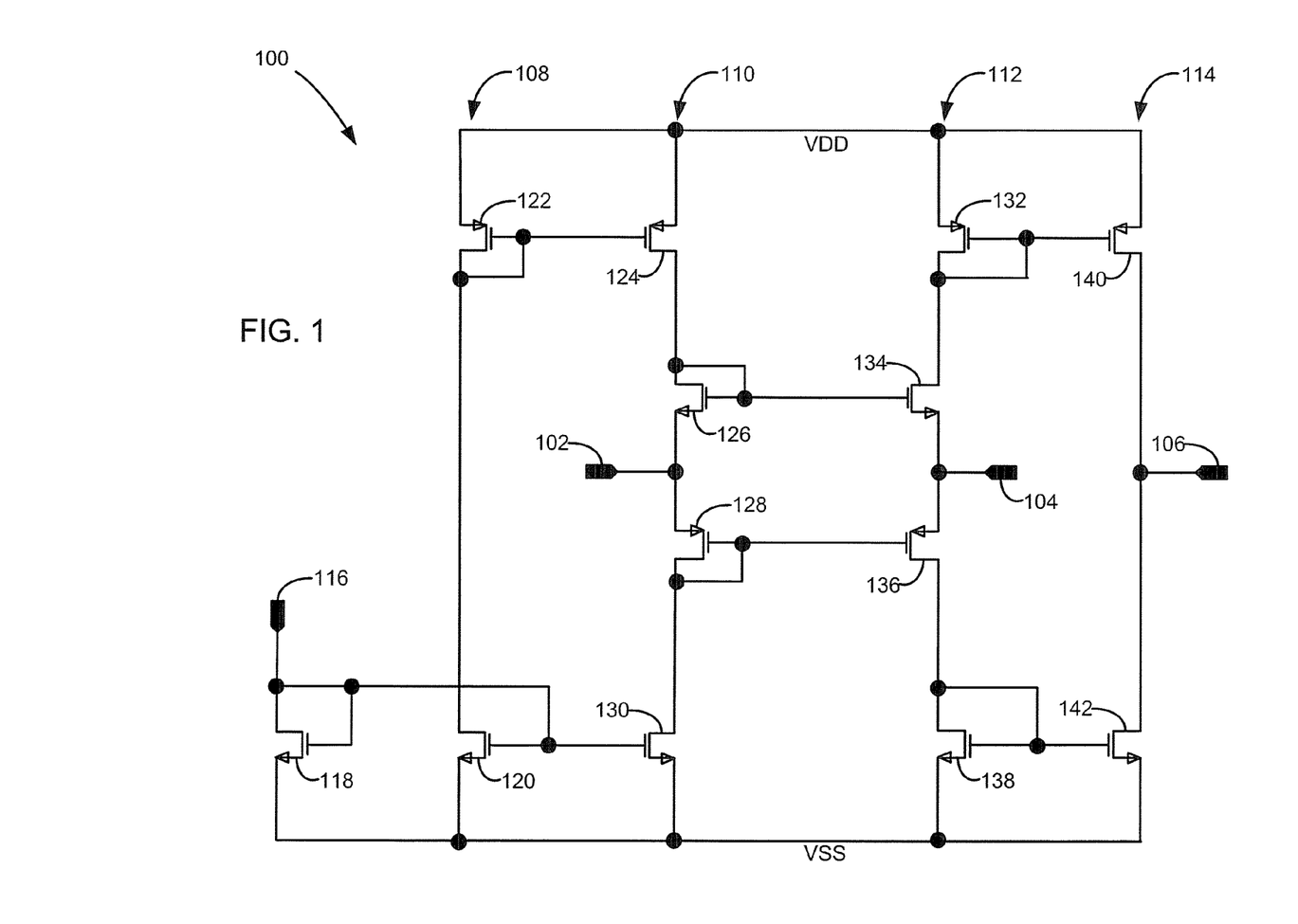
FIG. 1 is a circuit diagram of a current conveyor circuit, according to an example.

FIG. 1 is a circuit diagram of a current conveyor circuit 100, according to an example. As shown in FIG. 1, the current conveyor circuit 100 includes a Y terminal 102, an X terminal 104, a Z terminal 106, a current reference leg 108, a Y leg 110, an X leg 112, and a Z leg 114. The current reference leg 108 includes input 116 and transistors 118, 120, and 122, the Y leg 110 includes the Y terminal 102 and transistors 124, 126, 128, and 130, the X leg 112 includes the X terminal 104 and transistors 132 (also known as a positive transistor), 134, 136, and 138 (also known as a negative transistor), and the Z leg 114 includes the Z terminal 106 and transistors 140 and 142.

It should be understood that the illustrated embodiments are exemplary only, and should not be taken as limiting the scope of the present invention. For instance, the current conveyor circuit 100 may take other configurations (e.g., each of the current reference leg 108, Y leg 110, X leg 112, and Z leg 114 may take other arrangements, and one or more of the above legs may not be included in the circuit), so long as the current conveyor circuit 100 is operable to at least perform the functions described herein. Further, the current conveyor circuit 100 may be a first- or second-generation current conveyor circuit, or any other type of current conveyor circuit. Additionally, the current conveyor circuit 100 may include other elements. As an example, although illustrated to include transistors that are n-channel and p-channel MOSFETs, the current conveyor circuit 100 may include any of a variety of semiconductor devices, such as bipolar junction transistor devices and other field effect transistor devices.

The current conveyor circuit 100 ideally has predictable voltage relationships. For instance, a reference voltage applied to the Y terminal 102 preferably drives an approximately equal voltage at the X terminal 104. Typically, if the voltage at the X terminal 104 drops below the reference voltage applied to the Y terminal 102, then the current through transistor 134 will increase and the current through transistor 136 will decrease, thereby increasing the voltage at the X terminal 104. On the other hand, if the voltage at the X terminal 104 becomes greater than the reference voltage applied to the Y terminal 102, then the current through transistor 134 will decrease and the current through transistor 136 will increase, thereby decreasing the voltage at the X terminal 104.

Additionally, the current conveyor circuit 100 ideally has predictable current relationships. In operation, the input 116 and transistors 118, 120, and 122 of the current reference leg 108 cooperatively drive a reference current through the Y leg 110. In particular, the current through transistor 118 is mirrored through transistor 130 (since the transistors 118 and 130 cooperatively act as a current mirror), the current through transistor 120 drives an ideally equal current through transistor 122, and the Current through transistor 122 is mirrored through transistor 124 (since the transistors 122 and 124 cooperatively act as a current mirror). Then, the current through transistor 124 drives an ideally equal current through transistor 126, and likewise, the current through transistor 130 drives an ideally equal current through transistor 128

The Y leg 110, in turn, drives an approximately equal current through the X leg 112. In particular, the current through transistor 126 is mirrored through transistor 134 (since the transistors 126 and 134 cooperatively act as a Current mirror), and the current through transistor 134 drives an ideally equal current through transistor 132. Further, the current through transistor 128 is mirrored through transistor 136 (since the transistors 128 and 136 cooperatively act as a current mirror), and the current through transistor 136 drives an ideally equal current through transistor 138.

The current through the X leg 112 then drives an approximately equal current through the Z leg 114. In particular, the current through transistor 132 is mirrored through transistor 140 (since the transistors 132 and 140 cooperatively act as a current mirror), and the current through transistor 138 is mirrored through transistor 142 (since the transistors 138 and 142 cooperatively act as a current mirror).

In addition to the above current relationships, an input current applied to the X terminal 104 (i.e., a current drained from the X terminal 104) is preferably conveyed to the Z terminal 106. For instance, as the current reference leg 108 drives a reference current through the Y leg 110, and as the Y leg drives an approximately equal current through the X leg 112, a current may be drained from the X terminal 104. The current drained from the X terminal 104 is preferably conveyed to the Z terminal 106, which is preferably at a high impedance level.

To illustrate, as a current is drained from the X terminal 104, the current through transistor 134 increases. As the current through transistor 134 increases, the current driven through transistor 132 (the positive transistor) also increases. The increased current through transistor 132 may be called a 'positive transistor current.' The positive transistor current through transistor 132 is then mirrored through transistor 140. Similarly, as the current is drained from the X terminal 104, the current through transistor 136 decreases. As the current through the transistor 136 decreases, the current driven through the transistor 138 (the negative transistor) also decreases. The decreased current through transistor 138 may be called a 'negative transistor current.' The negative transistor current through transistor 138 is then mirrored through transistor 142. The difference between the respective currents driven through transistors 140 and 142 is conveyed to the Z terminal 106, and preferably, equals the current drained form the X terminal 104. Hence, the current drained from the X terminal 104 is conveyed to the Z terminal 106.

However, the current drained from the X terminal 104 will be accurately conveyed to the Z terminal 106 only when the current drained from the X terminal 104 is much smaller than the reference current driven through the Y leg 110 (e.g., 10× smaller). Particularly, if the current drained from the X terminal 104 exceeds a threshold current ratio between current drained from the X terminal 104 and the reference current driven through the Y leg 110, then the current drained from the X terminal 104 will not be accurately conveyed to the Z terminal 106.

The threshold current ratio may take any of a variety of ratios and/or ranges of ratios. For instance, the threshold current ratio may be one-to-ten (i.e., if the Current drained from the X terminal 104 exceeds one-tenth of the reference current driven through the Y leg 110, then the current drained from the X terminal 104 will not be accurately conveyed to the Z terminal 106), or a range such as one-to-two to four-to-five (i.e., if the current drained from the X terminal 104 falls between or exceeds one-half to four-fifths of the reference current driven through the Y leg 110, then the current drained from the X terminal 104 will not be accurately conveyed to the Z terminal 106). Of course, other examples exist for the threshold current ratio.

To illustrate, if the current drained from the X terminal 104 exceeds a threshold current ratio, then the current through transistor 136 will decrease to the point where the transistor 136 turns off (or begins to turn off). When transistor 136 turns off, the current through transistor 136 will be a zero current. Consequently, the transistors 138 and 142 will also turn off, and the respective currents through the transistors 138 and 142 will also be zero currents (hence, the negative transistor current will be a zero current). In the situation where transistors 136, 138, and 142 turn off (or at least begin to turn off), then the current drained from the X terminal 104 will not be accurately conveyed to the Z terminal 106 (the current conveyed to the Z terminal 106 will be less than the current drained from the X terminal 104).

Figure 2:
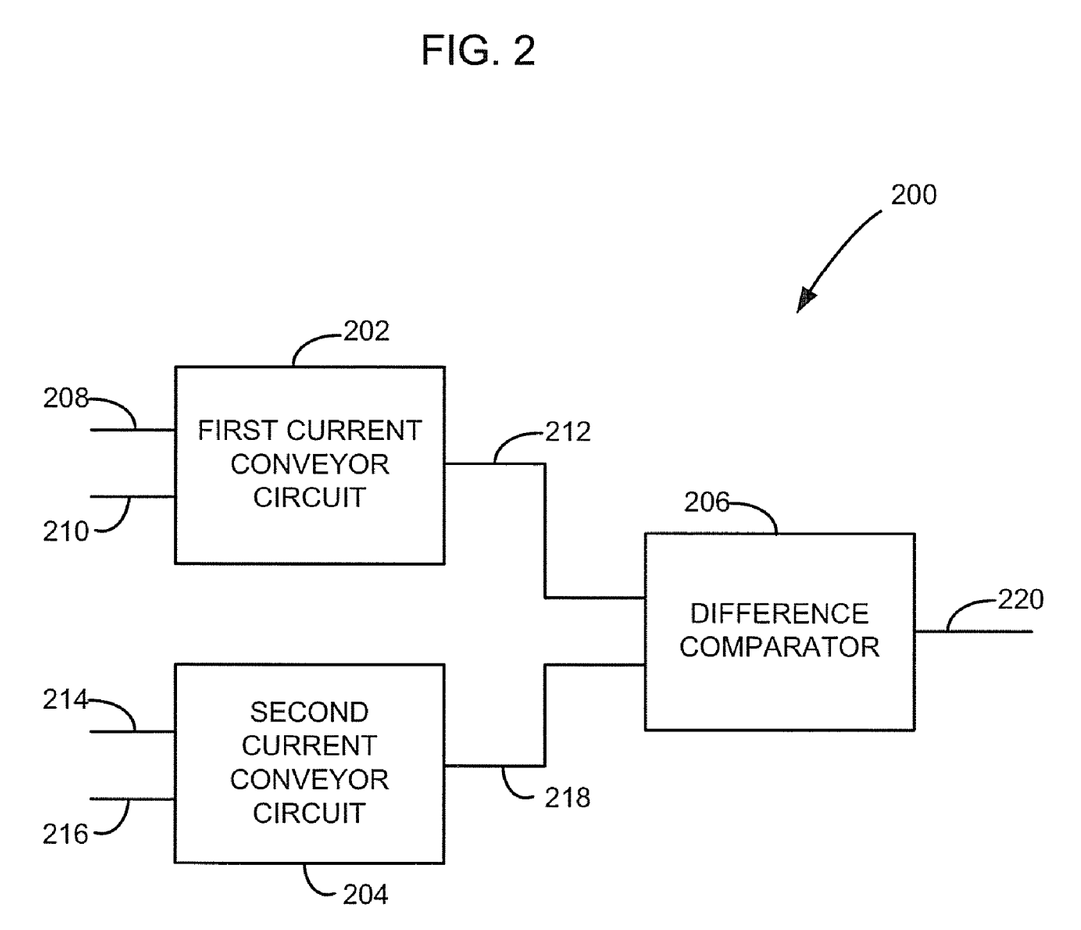
FIG. 2 is a block diagram of a first current conveyor circuit, a second current conveyor circuit, and a difference comparator for comparing input currents, according to an example.

With such current characteristics, the input current (i.e., the current drained from the X terminal 104) and output current (i.e., the current conveyed to the Z terminal 106) for current conveyor circuits are usually small. Consequently, using current conveyor circuits to compare input currents may be problematic. For instance, FIG. 2 is a block diagram 200 of a first current conveyor circuit 202, a second current conveyor circuit 204, and a difference comparator 206 for comparing input currents, according to an example. The first current conveyor circuit 202 includes a Y terminal 208, an X terminal 210, and a Z terminal 212, the second current conveyor circuit 204 includes a Y terminal 214, an X terminal 216, and a Z terminal 218, and the difference comparator 206 receives the Z terminals 212 and 218 as respective inputs, and provides an output 220.

To compare the current drained from the X terminal 210 to the current drained from the X terminal 216, the difference comparator 206 may compare the Z terminal 212 output current to the Z terminal 218 output current. Ideally, if the Z terminal 212 output current is greater than the Z terminal 218 output current, then one may infer that the current drained from the X terminal 210 is greater than the current drained from the X terminal 216. On the other hand, if the Z terminal 212 output current is less than the Z terminal 218 output current, then one may infer that the current drained from the X terminal 210 is less than the current drained from the X terminal 216.

However, the inferences about the currents drained from the respective X terminals 210 and 216 based on the comparison of the output currents from the corresponding Z terminals 212 and 218 are accurate only for small currents. Specifically, these inferences are accurate only if each of the currents drained from the respective X terminals 210 and 216 does not exceed a respective threshold current ratio. If, for example, the current drained from the X terminal 210 of the first current conveyor circuit 202 exceeds a threshold current ratio, then the negative transistor of the first current conveyor circuit 202 will turn off, and the negative transistor current produced by the negative transistor will be a zero current. In such a case, the current drained from the X terminal 210 will not be accurately conveyed to the Z terminal 212. Similarly, if the current drained from the X terminal 216 of the second current conveyor circuit 204 exceeds a threshold current ratio, then the current drained from the X terminal 216 will also not be accurately conveyed to the Z terminal 218. In either of these cases, an inference about the currents drained from the respective X terminals 210 and 216 based on a comparison of output currents of the corresponding Z terminals 212 and 218 cannot be accurately made.

Hence, to maintain the accuracy of such inferences, the currents drained from the respective X terminals 210 and 216 are typically small (e.g., 0.1 mA to 0.2 mA). As such, the respective output currents of the corresponding Z terminals 212 and 218 are also typically small, and the current difference between the output currents is also usually small. However, when the respective output currents of the corresponding Z terminals 212 and 218 are small, and when the current difference between the two output currents is small, the difference comparator 206 may be slow to detect the current difference (e.g., if the difference comparator 206 includes parasitic capacitors, the small output currents may be slow in charging the parasitic capacitors), and may not accurately detect the current difference.

Figure 3:
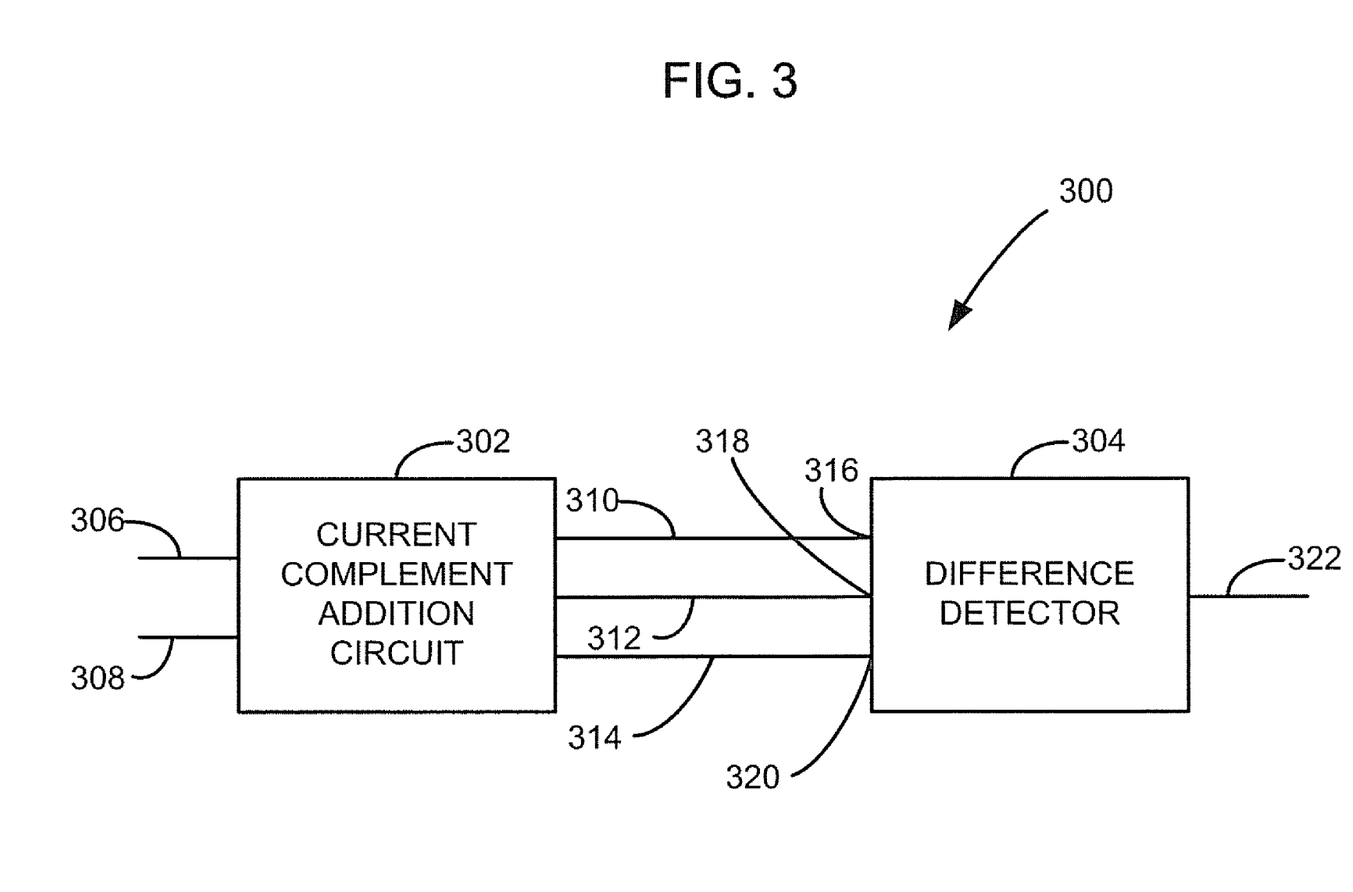
FIG. 3 is a block diagram of a current complement addition circuit and a difference detector for comparing currents, according to an example.

FIG. 3 is a block diagram 300 of a current complement addition circuit 302 and a difference detector 304 for comparing currents, according to an example. The current complement addition circuit 302 includes a first X terminal 306, a second X terminal 308, a first current output 310, a second current output 312, and a summed current output 314. The difference detector 304 includes a first input 316, a second input 318, a third input 320, and an output 322. The first current output 310 is coupled to the first input 316, the second current output 312 is coupled to the second input 318, and the summed current output 314 is coupled to the third input 320.

Figure 4:
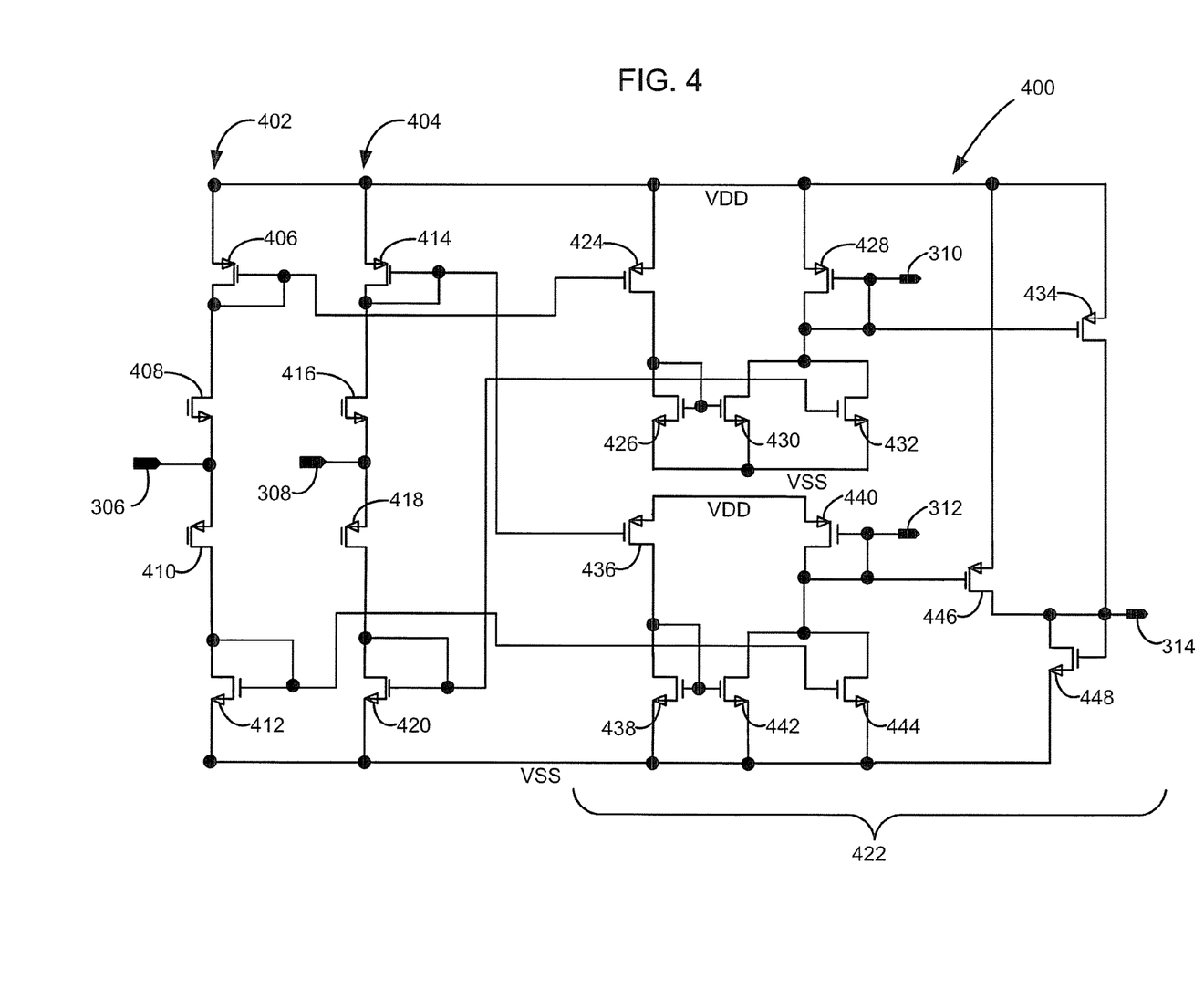
FIG. 4 is a circuit diagram of a current complement addition circuit for receiving a wide-input current range, according to an example.

FIG. 4 is a circuit diagram of a current complement addition circuit 400 for receiving a wide-input current range, according to an example. The current complement addition circuit 400 may be used in the current complement addition circuit 302 depicted in FIG. 3. As illustrated, the current complement addition circuit 400 includes the first X terminal 306, the second X terminal 308, the first current output 310, the second current output 312, and the summed current output 314. Further, the current complement addition circuit 400 includes a first X leg 402 of a first current conveyor circuit, the first X leg 402 including the first X terminal 306 and transistors 406 (the first positive transistor), 408, 410, and 412 (the first negative transistor). The first current conveyor circuit may be substantially the same as the current conveyor circuit 100. For instance, the first current conveyor circuit may include a first Y leg that includes a first Y terminal with a reference voltage applied to the first Y terminal, a first current reference leg, and a first Z leg. The first Y leg, first current reference leg, and first Z leg may be substantially the same as those depicted in FIG. 1. In an alternative embodiment, the first Z leg may not be included in the first current conveyor circuit.

In operation, when the first current reference leg drives a reference current through the first Y leg, the first Y leg, in turn, drives an approximately equal current through the first X leg 402. When a current is drained from the first X terminal 306, the transistor 406 (the first positive transistor) produces a first positive transistor current, and the transistor 412 (the first negative transistor) produces a first negative transistor current.

The current complement addition circuit 400 also includes a second X leg 404 of a second current conveyor circuit, the second X leg 404 including the second X terminal 308 and transistors 414 (the second positive transistor), 416, 418, and 420 (the second negative transistor). The second current conveyor circuit may be substantially the same as the current conveyor circuit 100. For instance, the second current conveyor circuit may include a second Y leg that includes a second Y terminal with a reference voltage applied to the second Y terminal, a second current reference leg, and a second Z leg. The second Y leg, second current reference leg, and second Z leg may be substantially the same as those depicted in FIG. 1. In an alternative embodiment, the second Z leg may not be included in the second current conveyor circuit.

In operation, when the second current reference leg drives a reference current through the second Y leg, the second Y leg, in turn, drives an approximately equal current through the second X leg 404. When a current is drained from the second X terminal 308, the transistor 414 (the second positive transistor) produces a second positive transistor current, and the transistor 420 (the second negative transistor) produces a second negative transistor current.

The current complement addition circuit 400 also includes an adder 422, which is coupled to first and second current conveyor circuits. The adder 422 may take a variety of configurations and include any of a variety of semiconductor devices, so long as the adder 422 is operable to at least perform the functions described herein. As illustrated, the adder 422 is coupled to transistors 406 (the first positive transistor) and 412 (the first negative transistor) of the first current conveyor circuit, and transistors 414 (the second positive transistor) and 420 (the second negative transistor) of the second current conveyor circuit.

In operation, the adder 422 sums the first positive transistor current and the second negative transistor current to produce the first current output 310, sums the first negative transistor current and the second positive transistor current to produce the second current output 312, and sums the first current output 310 and the second current output 312 to produce the summed current output 314. In particular, the adder 422 includes the transistors 424, 426, 428, 430, 432, 434, 436, 438, 440, 442, 444, 446, and 448. The transistors 424, 426, 428, 430, and 432 cooperatively sum the currents through transistors 406 (the first positive transistor current) and 420 (the second negative transistor current) to produce the first current output 310. The transistors 436, 438, 440, 442, and 444 cooperatively sum the currents through transistors 412 (the first negative transistor current) and 414 (the second positive transistor current) to produce the second current output 312. Further, the transistors 434, 446, and 448 cooperatively sum the first current output 310 and second current output 312 to produce the summed current output 314.

Since the current complement addition circuit 400 sums the first positive transistor current and the second negative transistor current, and sums the first negative transistor current and the second positive transistor current (i.e., the current complement addition circuit 400 sums the complementary currents from the first X leg 402 of the first current conveyor circuit and the second X leg 404 of the second current conveyor circuit), the current complement addition circuit 400 allows for larger currents to be drawn from the first X terminal 306 and/or the second X terminal 308, and thus allows for receiving a wide-input current range.

To illustrate, a current above a threshold Current ratio may be drained from the first X terminal 306 such that transistor 412 (the first negative transistor) turns off. When the transistor 412 turns off the first negative transistor current will be a zero current. However, even when the first negative transistor current is a zero current, the second current output 312 will still nonetheless be a non-zero current, because the second current output 312 also includes the second positive transistor current from transistor 414 (the second positive transistor). Similarly, a current above a threshold current ratio may be drained from the second X terminal 308 such that transistor 420 (the second negative transistor) turns off. When the transistor 420 turns off, the second negative transistor current will be a zero current. However, even when the second negative transistor current is a zero current, the first current output 310 will still nonetheless be a non-zero current, because the first current output 310 also includes the first positive transistor current from transistor 406 (the first positive transistor).

Because the first current output 310 and second current output 312 are each non-zero currents even when the respective first and second negative transistor currents are zero currents, the current complement addition circuit 400 allows for larger currents to be drained from the first X terminal 306 and/or the second X terminal 308 (e.g., as compared to using the current conveyor circuit of FIG. 1). Thus, the current complement addition circuit 400 allows for receiving a wide-input current range.

Additionally, since larger currents are allowed to be drained from the first X terminal 306 and/or second X terminal 308, each of the first current output 310 and the second current output 312 may be larger currents, and the current difference between the two output currents may be larger as well (e.g., as compared to using the current conveyor circuits of FIG. 2 to compare input currents). Since the current difference between the first current output 310 and second current output 312 may be larger (e.g., 1 mA to 2 mA), the difference detector 304 may be able to more quickly and accurately detect the current difference.

Figure 5:
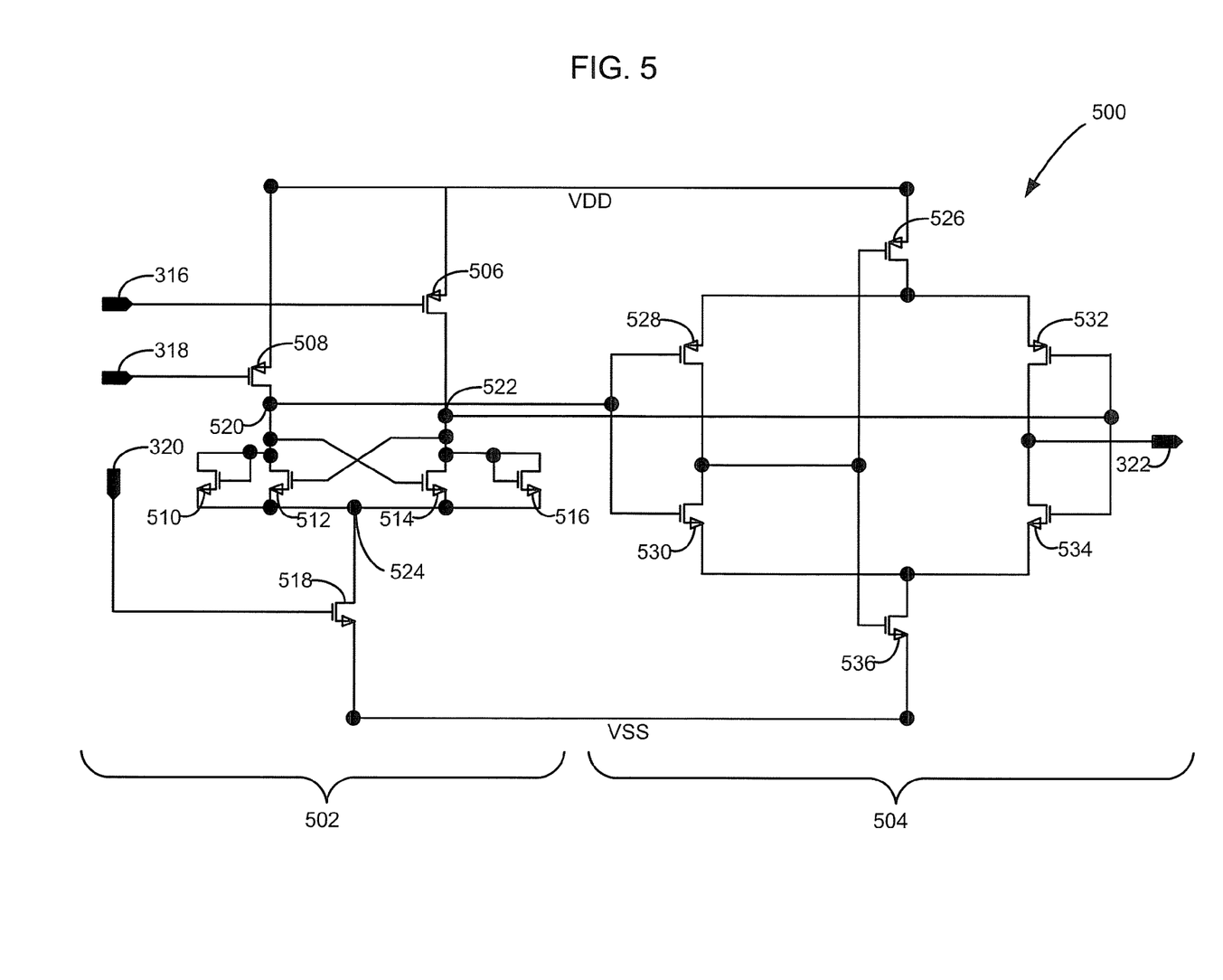
FIG. 5 is a circuit diagram of a difference detector for detecting a current difference, according to an example.

FIG. 5 is a circuit diagram of a difference detector 500 for detecting a current difference, according to an example. The difference detector 500 may be used in the difference detector 304 depicted in FIG. 3. According to FIG. 5, the difference detector 500 includes a differential amplifier 502 and a comparator 504. The differential amplifier includes a first current load input 316 (the first input 316 as shown in FIG. 3), a second current load input 318 (the second input 318 as shown in FIG. 3), a reference current input 320 (the third input 320 as shown in FIG. 3), a first voltage output 522, and a second voltage output 520. The comparator 504 receives as inputs the first voltage output 522 and the second voltage output 520, and provides the output 322. Of course, other examples exist for the difference detector 500. As examples, the difference detector 500 may not include the comparator 504 altogether, or may include a circuit other than the comparator 504.

In operation, the first current output 310 is coupled to the first current load input 316 and the second current output 312 is coupled to the second current load input 318 such that the differential amplifier 502 produces the first voltage output 522 corresponding to the first current output 310 and the second voltage output 520 corresponding to the second current output 312. As shown, the differential amplifier 502 includes transistors 506, 508, 510, 512, 514, 516, and 518. The transistors 506 and 508 pass the first current load input 316 and the second current load input 318, respectively, to transistors 510, 512, 514, and 516. The transistors 510, 512, 514, and 516 cooperatively convert the first current load input 316 and second current load input 318 into the first voltage output 522 and second voltage output 520, respectively.

Further, the summed current output 314 is connected to the reference current input 320 of the differential amplifier 502 to hold an average of the first voltage output 522 and the second voltage output 520 substantially constant. As illustrated, the reference current input 320 biases the transistor 518 to regulate the voltage at node 524. Connecting the summed current output 314 (i.e., the sum of the first current output 310 and the second current output 312) to the reference current input 320 stabilizes the voltage at node 524 relative to the first current load input 316 and the second current load input 318. When the voltage at node 524 is stabilized relative to the first current load input 316 and the second current load input 318, the transistors 510, 512, 514, and 516 produce the first voltage output 522 corresponding to the first current output 310 and the second voltage output 520 corresponding to the second current output 312. Further, stabilizing the voltage at node 524 relative to the first current load input 316 and the second current load input 318 holds an average of the first voltage output 522 and the second voltage output 520 substantially constant.

As noted, the comparator 504 receives as inputs the first voltage output 522 and the second voltage output 520, and provides the output 322. The comparator 504 compares the first voltage output 522 and the second voltage output 520 to provide an indication as to whether the first current output 310 is greater than the second current output 312.

In particular, the comparator 504 includes transistors 526, 528, 530, 532, 534, and 536. The transistors 526, 528, 530,

532, 534, and 536 cooperatively compare the first voltage output 522 to the second voltage output 520. Specifically, if the first voltage output 522 is greater than the second voltage output 520 (i.e., if the first current output 310 is greater than the second current output 312), then the comparator 504 outputs a logic '0' via the output 322. On the other hand, if the first voltage output 522 is less than the second voltage output 520 (i.e., if the first current output 310 is less than the second current output 312), then the comparator 504 outputs a logic '1' via the output 322.

Figure 6:
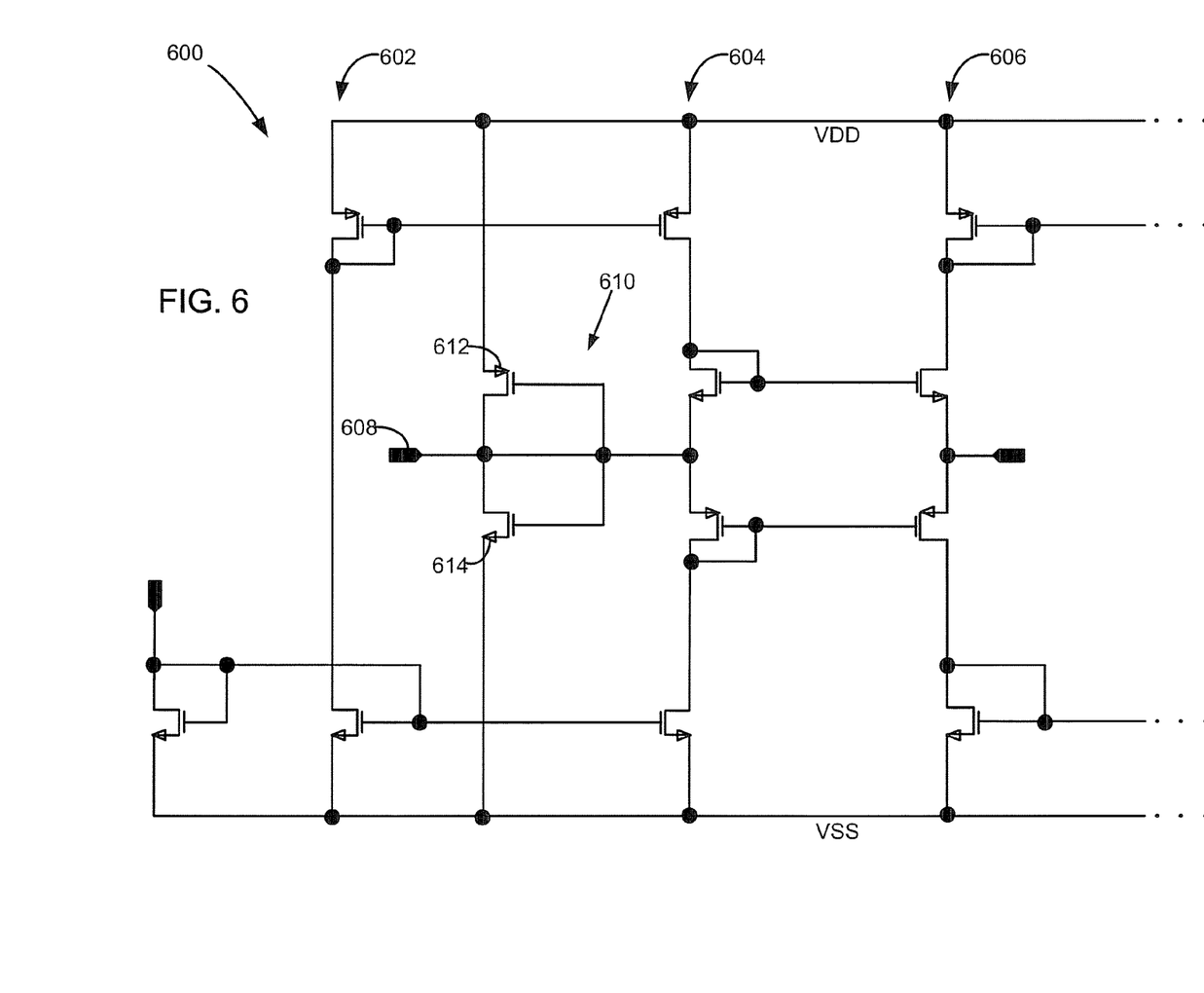
FIG. 6 is a circuit diagram of an improved current conveyor circuit, according to an example.

As set forth above, the current complement addition circuit 302 and difference detector 304 may be used to compare currents (e.g., a wide-input current range). To overcome problems with reference voltage fluctuations, for instance, the improved current conveyor circuit 600 of FIG. 6 may be used in conjunction with the current complement addition circuit 302. As illustrated, the improved current conveyor circuit 600 includes a current reference leg 602, a Y leg 604 including a Y terminal 608, and an X leg 606. The improved current conveyor circuit 600 may also include a Z leg (not depicted), be coupled to the adder 422, and/or be included as part of the current complement addition circuit 302, as examples. As illustrated, the improved current conveyor circuit 600 includes an inverter 610, which includes transistors 612 and 614, with unity feedback coupled to the Y terminal 608. Coupling the inverter 610 with unity feedback to the Y terminal 608 holds the reference voltage applied to the Y terminal 608 substantially constant. The improved current conveyor circuit 600 may be used in place of either, or both, the first and second current conveyor circuits of FIG. 4.

Figure 7:
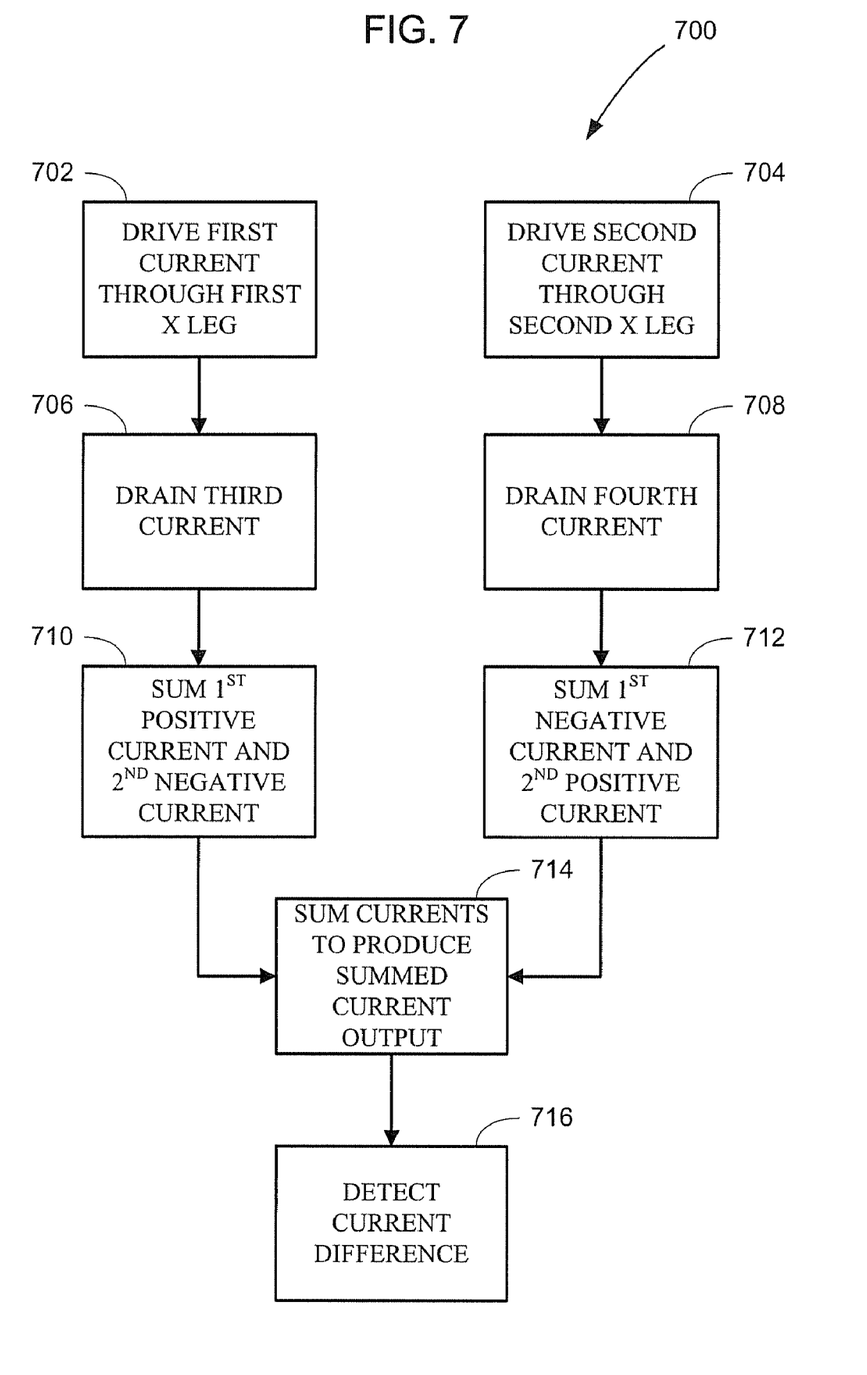
FIG. 7 is a flow chart of a method for comparing currents.

FIG. 7 is a flow chart of a method 700 for comparing currents. In a circuit including a first current conveyor circuit that includes a first X leg with a first X terminal, and a second current conveyor circuit that includes a second X leg with a second X terminal, at block 702, the method 700 drives a first current through the first X leg. Further, at block 704, the method 700 drives a second current through the second X leg.

At block 706, the method 700 drains a third current from the first X terminal to produce a first positive transistor current and a first negative transistor current. At block 708, the method 700 drains a fourth current from the second X terminal to produce a second positive transistor current and a second negative transistor current. As illustrated in FIG. 4, the first current conveyor circuit may include the first positive transistor 406 and the first negative transistor 412. Draining the third current from the first X terminal to produce the first positive transistor current and the first negative transistor current may include the first positive transistor 406 producing the first positive transistor current and the first negative transistor 412 producing the first negative transistor current. Similarly, the second current conveyor circuit may include the second positive transistor 414 and the second negative transistor 420. Draining the fourth current from the second X terminal to produce the second positive transistor current and the second negative transistor current may include the second positive transistor 414 producing the second positive transistor current and the second negative transistor 420 producing the second negative transistor current.

Further, draining the third current from the first X terminal may include draining a current above a threshold current ratio from the first X terminal to turn off the first negative transistor 412. When the first negative transistor 412 turns off, the first negative transistor current is a zero current. And when the first negative transistor current is a zero current, the second current output is still a non-zero current. Similarly, draining the fourth current from the second X terminal may include draining a current above a threshold current ratio from the second X terminal to turn off the second negative transistor 420. When the second negative transistor 420 turns off the second negative transistor current is a zero current. And when the second negative transistor current is a zero current, the first current output is still a non-zero current.

At block 710, the method 700 sums the first positive transistor current and the second negative transistor current to produce the first current output 310. In an embodiment, the adder 422 sums the first positive transistor current and the second negative transistor current. Also, at block 712, the method 700 sums the first negative transistor current and the second positive transistor current to produce the second current output 312. In one embodiment, the adder 422 sums the first negative transistor current and the second positive transistor current. Further, at block 714, the method 700 sums the first current output 310 and the second current output 312 to produce the summed current output 314. In an embodiment, the adder 422 sums the first current output 310 and the second current output 312.

At block 716, the method 700 detects a current difference. As an example, the circuit may include the differential amplifier 502 that includes the first current load input 316 and the second current load input 318. In an embodiment, the method 700 couples the first current output 310 to the first current load input 316 and couples the second current output 312 to the second current load input 318 to cooperatively produce the first voltage output 522 corresponding to the first current output 310 and the second voltage output 520 corresponding to the second current output 312. The differential amplifier 502 may also include the reference current input 320, and the method 700 may further connect the summed current output 314 to the reference current input 320 to hold an average of the first voltage output 522 and the second voltage output 520 substantially constant.

Further, at block 716, the method 700 may compare the first voltage output 522 to the second voltage output 520 to provide an indication as to whether the first current output 310 is greater than the second current output 312. As an example, the comparator 504 may be used to compare the first voltage output 522 to the second voltage output 520. If the first voltage output 522 is greater than the second voltage output 520 (i.e., if the first current output 310 is greater than the second current output 312), then the comparator 504 outputs a logic '0' via the output 322. On the other hand, if the first voltage output 522 is less than the second voltage output 520 (i.e., if the first current output 310 is less than the second current output 312), then the comparator 504 outputs a logic '1' via the output 322.

Additionally, the first current conveyor circuit may include a first Y leg that includes a first Y terminal, and a first reference voltage may be applied to the first Y terminal. In one embodiment, the method 700 holds the first reference voltage substantially constant by coupling a first inverter with unity feedback to the first Y terminal. Further, the second current conveyor circuit may include a second Y leg that includes a second Y terminal, and a second reference voltage may be applied to the second Y terminal. In another embodiment, the method 700 holds the second reference voltage substantially constant by coupling a second inverter with unity feedback to the second Y terminal.

Disclosed above are methods and systems for comparing currents. Since the current complement addition circuit 400, for instance, sums the first positive transistor current and the second negative transistor current and sums the first negative transistor current and the second positive transistor current from respective first and second current conveyor circuits (i.e., the current complement addition circuit 400 sums the complementary currents from the first X leg 402 of the first current conveyor circuit and the second X leg 404 of the second current conveyor circuit), the current complement addition circuit 400 allows for larger currents to be drawn from the first X terminal 306 and/or the second X terminal 308 (e.g., as compared to using the current conveyor circuit of FIG. 1). Specifically, the first current output 310 and second current output 312 are each non-zero currents even when the respective first and second negative transistor currents are zero currents. Hence, the current complement addition circuit 400 allows for receiving a wide-input current range.

Additionally, since larger currents are allowed to be drained from the first X terminal 306 and/or second X terminal 308, each of the first current output 310 and the second current output 312 may be larger currents, and the current difference between the two output currents may be larger as well (e.g., as compared to using the current conveyor circuits of FIG. 2 to compare input currents). Since the current difference between the first current output 310 and second current output 312 may be larger, the difference detector 304 may be able to more quickly and accurately detect the current difference.

It should be understood that the illustrated embodiments are examples only and should not be taken as limiting the scope of the present invention. The claims should not be read as limited to the described order or elements unless stated to that effect. Therefore, all embodiments that come within the scope and spirit of the following claims and equivalents thereto are claimed as the invention.

We claim:

1. In a circuit comprising a first current conveyor circuit including a first X leg that includes a first X terminal, and a second current conveyor circuit including a second X leg that includes a second X terminal, a method for comparing currents, the method comprising:
   driving a first current through the first X leg;
   driving a second current through the second X leg;
   draining a third current from the first X terminal to produce a first positive transistor current and a first negative transistor current;
   draining a fourth current from the second X terminal to produce a second positive transistor current and a second negative transistor current;
   summing the first positive transistor current and the second negative transistor current to produce a first current output;
   summing the first negative transistor current and the second positive transistor current to produce a second current output; and
   summing the first current output and the second current output to produce a summed current output.

2. The method of claim 1:
   wherein the first current conveyor circuit includes a first positive transistor and a first negative transistor;
   wherein the second current conveyor circuit includes a second positive transistor and a second negative transistor;
   wherein draining the third current includes the first positive transistor producing the first positive transistor current and the first negative transistor producing the first negative transistor current; and
   wherein draining the fourth current includes second positive transistor producing the second positive transistor current and the second negative transistor producing the second negative transistor current.

3. The method of claim 2, wherein draining the third current comprises draining a current above a threshold current ratio from the first X terminal to turn off the first negative transistor, and wherein, when the first negative transistor turns off, the first negative transistor current is a zero current and the second current output is a non-zero current.

4. The method of claim 2, wherein draining the fourth current comprises draining a current above a threshold current ratio from the second X terminal to turn off the second negative transistor, and wherein, when the second negative transistor turns off, the second negative transistor current is a zero current and the first current output is a non-zero current.

5. The method of claim 1, wherein:
   summing the first positive transistor current and the second negative transistor current to produce a first current output comprises an adder summing the first positive transistor current and the second negative transistor current;
   summing the first negative transistor current and the second positive transistor current to produce a second current output comprises the adder summing the first negative transistor current and the second positive; and
   summing the first current output and the second current output to produce a summed current output comprises the adder summing the first current output and the second current output.

6. The method of claim 1, wherein the circuit includes a differential amplifier that includes a first current load input and a second current load input, the method further comprising, coupling the first current output to the first current load input and coupling the second current output to the second current load input to cooperatively produce a first voltage output corresponding to the first current output and a second voltage output corresponding to the second current output.

7. The method of claim 6, wherein the differential amplifier includes a reference current input, the method further comprising, connecting the summed current output to the reference current input to hold an average of the first voltage output and the second voltage output substantially constant.

8. The method of claim 6, further comprising comparing the first voltage output to the second voltage output to provide an indication of whether the first current output is greater than the second current output.

9. The method of claim 1, wherein the first current conveyor circuit comprises a first Y leg that includes a first Y terminal, wherein a first reference voltage is applied to the first Y terminal, the method further comprising, holding the first reference voltage substantially constant by coupling a first inverter to the first Y terminal.

10. The method of claim 1, wherein the second current conveyor circuit comprises a second Y leg that includes a second Y terminal, wherein a second reference voltage is applied to the second Y terminal, the method further comprising, holding the second reference voltage substantially constant by coupling a second inverter to the second Y terminal.

11. A system for comparing currents, the system comprising:
   a first current conveyor circuit that includes a first Y leg and a first X leg, wherein the first X leg comprises a first X terminal, a first positive transistor, and a first negative transistor, wherein the first Y leg drives a first current through the first X leg, and wherein the first X terminal drains a second current such that the first positive transistor produces a first positive transistor current and the first negative transistor produces a first negative transistor current;
   a second current conveyor circuit that includes a second Y leg and a second X leg, wherein the second X leg comprises a second X terminal, a second positive transistor, and a second negative transistor, wherein the second Y leg drives a third current through the second X leg, and wherein the second X terminal drains a fourth current such that the second positive transistor produces a second positive transistor current and the second negative transistor produces a second negative transistor current; and an adder coupled to the first current conveyor circuit and the second current conveyor circuit, and operable to:
sum the first positive transistor current and the second negative transistor current to produce a first current output;
sum the first negative transistor current and the second positive transistor current to produce a second current output; and
sum the first current output and the second current output to produce a summed current output.

12. The system of claim 11, wherein the adder is coupled to the first positive transistor, first negative transistor, second positive transistor, and second negative transistor.

13. The system of claim 11, wherein the first X terminal drains a current above a threshold current ratio to turn off the first negative transistor, and wherein, when the first negative transistor turns off, the first negative transistor current is a zero current and the second current output is a non-zero current.

14. The system of claim 11, wherein the second X terminal drains a current above a threshold current ratio to turn off the second negative transistor, and wherein, when the second negative transistor turns off, the second negative transistor current is a zero current and the first current output is a non-zero current.

15. The system of claim 11, further comprising a differential amplifier coupled to the adder, wherein the differential amplifier includes a first current load input and a second current load input, and wherein the first current output is coupled to the first current load input and the second current output is coupled to the second current load input such that the differential amplifier produces a first voltage output corresponding to the first current output and a second voltage output corresponding to the second current output.

16. The system of claim 15, wherein the differential amplifier comprises a reference current input, and wherein the summed current output is connected to the reference current input of the differential amplifier to hold an average of the first voltage output and the second voltage output substantially constant.

17. The system of claim 15, further comprising a comparator coupled to the differential amplifier, wherein the comparator compares the first voltage output and the second voltage output to provide an indication of whether the first current output is greater than the second current output.

18. The system of claim 11, wherein the first Y leg includes a first Y terminal, wherein a first reference voltage is applied to the first Y terminal, the system further comprising a first inverter coupled to the first Y terminal to hold the first reference voltage substantially constant.

19. The system of claim 11, wherein the second Y leg includes a second Y terminal, wherein a second reference voltage is applied to the second Y terminal, the system further comprising a second inverter coupled to the second Y terminal to hold the second reference voltage substantially constant.

20. A system for comparing currents, the system comprising:
a first current conveyor circuit that includes a first Y leg and a first X leg, wherein the first X leg comprises a first X terminal, a first positive transistor, and a first negative transistor, wherein the first Y leg drives a first current through the first X leg, and wherein the first X terminal drains a second current such that the first positive transistor produces a first positive transistor Current and the first negative transistor produces a first negative transistor current;
a second current conveyor circuit that includes a second Y leg and a second X leg, wherein the second X leg comprises a second X terminal, a second positive transistor, and a second negative transistor, wherein the second Y leg drives a third current through the second X leg, and wherein the second X terminal drains a fourth current such that the second positive transistor produces a second positive transistor current and the second negative transistor produces a second negative transistor current;
an adder coupled to the first current conveyor circuit and the second current conveyor circuit, and operable to:
sum the first positive transistor current and the second negative transistor current to produce a first current output;
sum the first negative transistor current and the second positive transistor current to produce a second current output; and
sum the first current output and the second current output to produce a summed current output;
a differential amplifier coupled to the adder, wherein the differential amplifier includes a first current load input, a second current load input, and reference current input, wherein the first current output is coupled to the first current load input and the second current output is coupled to the second current load input to cooperatively produce a first voltage output corresponding to the first current output and a second voltage output corresponding to the second current output, and wherein the summed current output is connected to the reference current input of the differential amplifier to hold an average of the first voltage output and the second voltage output substantially constant; and
a comparator coupled to the differential amplifier, wherein the comparator compares the first voltage output and the second voltage output to provide an indication of whether the first current output is greater than the second current output.

* * * * *